(12) United States Patent
Huang et al.

(10) Patent No.: US 9,263,586 B2
(45) Date of Patent: Feb. 16, 2016

(54) QUANTUM WELL FIN-LIKE FIELD EFFECT TRANSISTOR (QWFINFET) HAVING A TWO-SECTION COMBO QW STRUCTURE

(71) Applicant: Taiwan Semiconductor Manufacturing Company, Ltd., Hsin-Chu (TW)

(72) Inventors: Yu-Lien Huang, Hsinchu County (TW); Chun-Hsiang Fan, Taoyuan County (TW); Yung-Ta Li, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/298,494

(22) Filed: Jun. 6, 2014

(65) Prior Publication Data

US 2015/0357472 A1    Dec. 10, 2015

(51) Int. Cl.
*H01L 27/088* (2006.01)
*H01L 29/78* (2006.01)
*H01L 29/775* (2006.01)
*H01L 29/66* (2006.01)

(52) U.S. Cl.
CPC ...... *H01L 29/7851* (2013.01); *H01L 29/66439* (2013.01); *H01L 29/66795* (2013.01); *H01L 29/775* (2013.01)

(58) Field of Classification Search
CPC .............. H01L 27/088; H01L 27/0886; H01L 27/7849; H01L 29/66977; H01L 21/823431
USPC .......................................... 257/190; 438/283
See application file for complete search history.

(56) References Cited

U.S. PATENT DOCUMENTS

| | | | |
|---|---|---|---|
| 5,439,723 A | 8/1995 | Miyashita et al. |
| 5,475,280 A | 12/1995 | Jones et al. |
| 5,736,753 A | 4/1998 | Ohno et al. |
| 6,093,592 A | 7/2000 | Nakabayashi et al. |
| 6,358,867 B1 | 3/2002 | Tews et al. |
| 6,475,857 B1 | 11/2002 | Kim et al. |
| 6,475,890 B1 | 11/2002 | Yu |
| 6,580,154 B2 | 6/2003 | Noble et al. |

(Continued)

FOREIGN PATENT DOCUMENTS

| | | |
|---|---|---|
| CN | 1643694 | 7/2005 |
| EP | 1 555 688 A2 | 7/2005 |

(Continued)

OTHER PUBLICATIONS

Fu-Liang Yang et al., "5 nm-Gate Nanowire FinFET," VSL Technology, 2004, Digest of Technical Papers, 2004 Symposium on Jun. 15-17, 2004, pp. 196-197.

(Continued)

*Primary Examiner* — Evan Pert
*Assistant Examiner* — Changhyun Yi
(74) *Attorney, Agent, or Firm* — Haynes and Boone, LLP

(57) ABSTRACT

The present disclosure provides a quantum well fin field effect transistor (QWFinFET). The QWFinFET includes a semiconductor fin over a substrate and a combo quantum well (QW) structure over the semiconductor fin. The combo QW structure includes a QW structure over a top portion of the semiconductor fin and a middle portion of the semiconductor fin. The semiconductor fin and the QW comprise different semiconductor materials. The QWFinFET also includes a gate stack over the combo QW structure.

20 Claims, 14 Drawing Sheets

(56) References Cited

U.S. PATENT DOCUMENTS

| | | | |
|---|---|---|---|
| 6,645,797 | B1 | 11/2003 | Buynoski et al. |
| 6,673,667 | B2 | 1/2004 | Gorrell et al. |
| 6,774,390 | B2 | 8/2004 | Sugiyama et al. |
| 6,835,246 | B2 | 12/2004 | Zaidi |
| 6,846,734 | B2 | 1/2005 | Amos et al. |
| 6,864,520 | B2 | 3/2005 | Fischetti et al. |
| 6,902,962 | B2 | 6/2005 | Yeo et al. |
| 6,911,379 | B2 | 6/2005 | Yeo et al. |
| 6,960,821 | B2 | 11/2005 | Noble et al. |
| 7,005,366 | B2 | 2/2006 | Chau et al. |
| 7,049,627 | B2 | 5/2006 | Vineis et al. |
| 7,063,799 | B2 | 6/2006 | Hayakawa et al. |
| 7,084,429 | B2 | 8/2006 | Forbes |
| 7,115,920 | B2 | 10/2006 | Bernstein et al. |
| 7,195,962 | B2 | 3/2007 | Cho et al. |
| 7,217,606 | B2 | 5/2007 | Forbes et al. |
| 7,291,886 | B2 | 11/2007 | Doris et al. |
| 7,294,417 | B2 | 11/2007 | Ren et al. |
| 7,335,603 | B2 | 2/2008 | Mancevski |
| 7,368,355 | B2 | 5/2008 | Bernstein et al. |
| 7,456,450 | B2 | 11/2008 | Dyer et al. |
| 7,521,376 | B2 | 4/2009 | Frank et al. |
| 7,671,420 | B2 | 3/2010 | Shin et al. |
| 7,754,560 | B2 | 7/2010 | Burnett et al. |
| 7,884,448 | B2 | 2/2011 | Dyer et al. |
| 8,159,006 | B2 | 4/2012 | Maeda et al. |
| 2006/0099782 | A1 | 5/2006 | Ritenour |
| 2009/0283829 | A1 | 11/2009 | Dyer et al. |
| 2013/0049068 | A1 | 2/2013 | Lin et al. |
| 2014/0217362 | A1* | 8/2014 | Ma et al. .......................... 257/14 |
| 2014/0353715 | A1* | 12/2014 | Xiao .............................. 257/190 |

FOREIGN PATENT DOCUMENTS

| | | |
|---|---|---|
| JP | 006005483 | 1/1994 |
| JP | 2002-359293 | 12/2002 |
| JP | 2003-243667 | 8/2003 |
| JP | 2003-332414 | 11/2004 |
| JP | 2005-317572 | 11/2005 |
| KR | 1020020095911 | 12/2002 |
| KR | 1020030095252 | 12/2003 |
| KR | 1020040094779 | 11/2004 |
| WO | WO 97/16854 | 5/1997 |
| WO | WO 03/003470 | 1/2003 |

OTHER PUBLICATIONS

M. Yang et al., "High Performance CMOS Fabricated on Hybrid Substrate with Different Crystal Orientations." IEEE, 2003, pp. 18.7.1-18.7.4.

James Jer-Hueih Chen et al., "Ultrathin $Al_2O_3$ and $HfO_2$ Gate Dielectrics on Surface-Nitrided Ge," vol. 51 No. 9 IEEE Transactions on Electronic Devices, Sep. 2004, pp. 1441-1447.

Chi On Chui et al., "Atomic Layer Deposition of High-K Dielectric for Germanium MOS Applications-Substrate Surface Preparation," vol. 25 No. 5, IEEE Electron Devices Letters, May 2004, pp. 274-276.

Xusheng Wu et al., "Impact of Non-Vertical Sidewall on Sub-50nm FinFET," IEEE International SOI Conference Proceedings, 2003, pp. 151-152.

Leland Chang et al., "CMOS Circuit Performance Enhancement by Surface Orientation Optimization," IEEE Transactions on Electron Devices, vol. 51, No. 10, Oct. 2004, pp. 1621-1627.

E. P. Gusev et al., "Microstructure and Thermal Stability of $HfO_2$ Gate Dielectric Deposited on Ge(100)," vol. 85, No. 12 Applied Physics Letters, Sep. 2004, pp. 2334-2336.

Nan Wu et al., "Effect of Surface $NH_3$ Anneal on the Physical and Electrical Properties of $HfO_2$ Films on Ge Substrate," vol. 84, No. 19 Applied Physics Letters, May 2004, pp. 3741-3743.

G. W. Anderson et al., "The S-Passivation of Ge(100)-(1X1)," vol. 66, No. 9 Applied Physics Letters, Feb. 1995, pp. 1123-1125.

X. J. Zhang et al., "Thermal Desorption of Ultraviolet-Ozone Oxidized Ge(001) for Substrate Cleaning," vol. 11, No. 5 J. Vac. Sci. Technol, Sep./Oct. 1993, pp. 2553-2561.

M. Göthelid et al., "Etching and a Disordered Overlayer on the Ge(100)-S Surface," 115 Applied Surface Science, 1997, pp. 87-95.

Qi Xiang et al., "Sidewall Faceting and Inter-Facet Mass Transport in Selectively Grown Epitaxial Layers on $SiO_2$-Masked Si(1 1 0) Substrates," J. of Crystal Growth, vol. 175-176, No. 3001, May 1997, pp. 469-472.

D. Bodlaki et al., "Ambient Stability of Chemically Passivated Germanium Interfaces," 543 Surface Science, Jul. 2003, pp. 63-74.

D. Bodlaki et al., "Infrared Second Harmonic Generation Spectroscopy of Ge(111) Interfaces," 119(7) Journal of Chemical Physics, Aug. 2003, pp. 3958-3962.

P. F. Lyman et al., "Structure of a Passivated Ge Surface Prepared from Aqueous Solution," 462 Surface Science, Apr. 2000, pp. L594-L598.

* cited by examiner

US 9,263,586 B2

QUANTUM WELL FIN-LIKE FIELD EFFECT TRANSISTOR (QWFINFET) HAVING A TWO-SECTION COMBO QW STRUCTURE

This application is related to patent applications U.S. Ser. No. 13/220,979 filed on Aug. 30, 2011, as "FinFET Device Having A Channel Defined In A Diamond-like Shape Semiconductor Structure;" U.S. Ser. No. 12/119,515 filed on May 13, 2008, as "FinFET with A V-shaped Channel;" U.S. Ser. No. 11/259,165 filed on Oct. 26, 2005, as "Method Of Forming A Semiconductor Structure Using A Non-Oxygen Chalcogen Passivation Treatment;" U.S. Ser. No. 11/281,599 filed on Nov. 18, 2005, as "Semiconductor Devices Having Faceted Channels And Methods Of Fabricating Such Devices;" and U.S. Ser. No. 12/500,396 filed on Jul. 9, 2009, as "High Performance 3D FET Structures, And Methods For Forming The Same Using Preferential Crystallographic Etching," the entire disclosures of which are hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
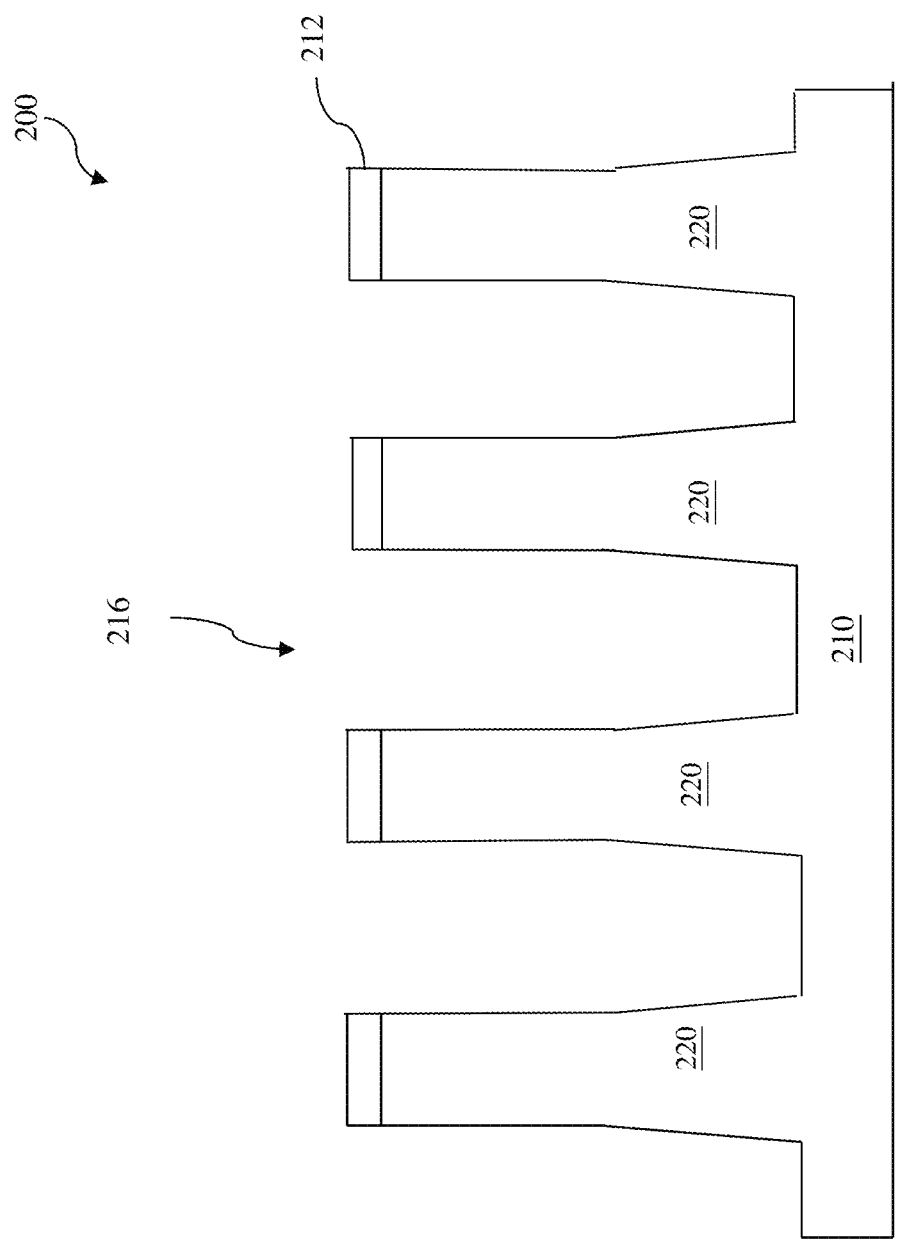
FIGS. 1, 2, 3, 4A-4E and 5A-5B are cross-sectional views of an example quantum well (QW) FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a quantum well fin-like field-effect transistor (QWFinFET) device. The QWFinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a QWFinFET example to illustrate various embodiments of the present invention. It is understood, however, that the application should not be limited to a particular type of device, except as specifically claimed.

FIGS. 1 through 7 are perspective views and cross-sectional views of intermediate stages in the manufacturing of a QWFinFET in accordance with some example embodiments. FIG. 1 illustrates a cross-sectional view of an initial structure. The initial structure includes a substrate 210. Substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide, or combinations thereof. Possible substrates 210 also include a silicon-on-insulator (SOI) substrate. SOI substrates are fabricated using separation by implantation of oxygen (SIMOX), wafer bonding, and/or other suitable methods. In the present embodiment, the substrate 210 includes a semiconductor material such as silicon, which may have a lower $D_{it}$ (interface trap density) than semiconductor materials of a QW structure, which will be described later.

A pad layer 212 may be disposed over substrate 210. The pad layer 212 may include an oxide (e.g., silicon oxide) or a nitride (e.g., silicon nitride) or composite films (e.g., silicon oxide/silicon nitride). The pad layer 212 may act as an etch stop layer or chemical mechanical polish (CMP) stop layer and a protective layer for portions of substrate 210 during the formation of an isolation region, such as shallow trench isolation (STI) regions (e.g., STI regions 222 illustrated in FIG. 2) in subsequent process steps. The substrate 210 and pad layer 212 are patterned to form trenches 216, for example, using a combination of photolithography and etching. An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. Dry etching processes may include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching). The portions of substrate 210 between trenches 216 are referred to as fins 220.

Figure 2:
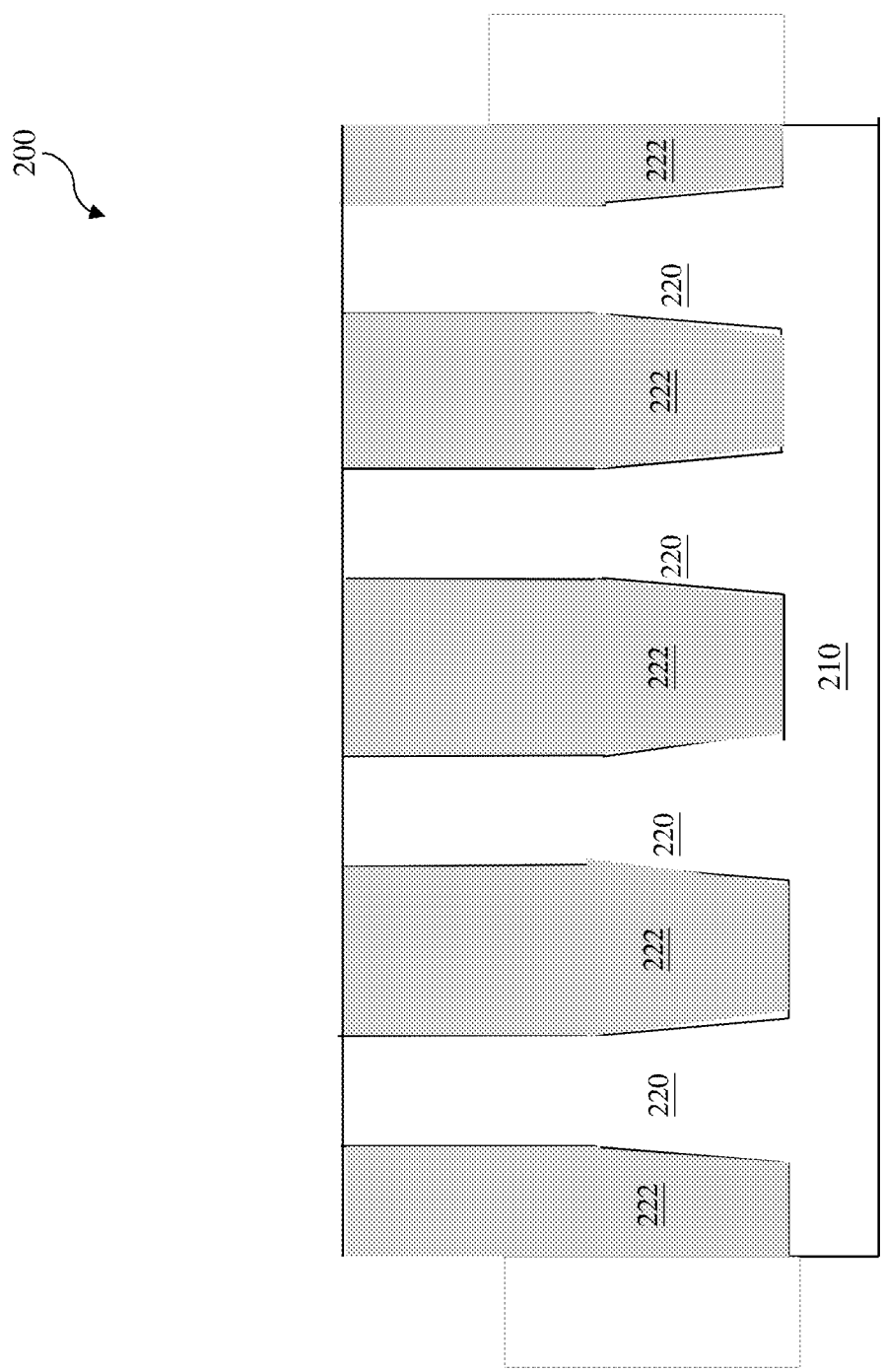

FIG. 2 illustrates completed STI regions 222 formed between fins 220. Trenches 216 may be filled with a dielectric material, such as, silicon oxide, silicon nitride, silicon oxynitride, fluoride-doped silicate glass (FSG, or another low-k dielectric material. The filling of trenches 216 may be done using any suitable process such as chemical vapor deposition (CVD), or the like. An annealing process may be performed on the dielectric material. A CMP or etch back process may be used to level a top surface of the dielectric material using pad layer 212 as an etch stop layer. Pad layer 212 may be removed after the CMP/etch back. The top surfaces of fins 220 and the top surfaces of STI regions 222 may be substantially level with each other.

Figure 3:
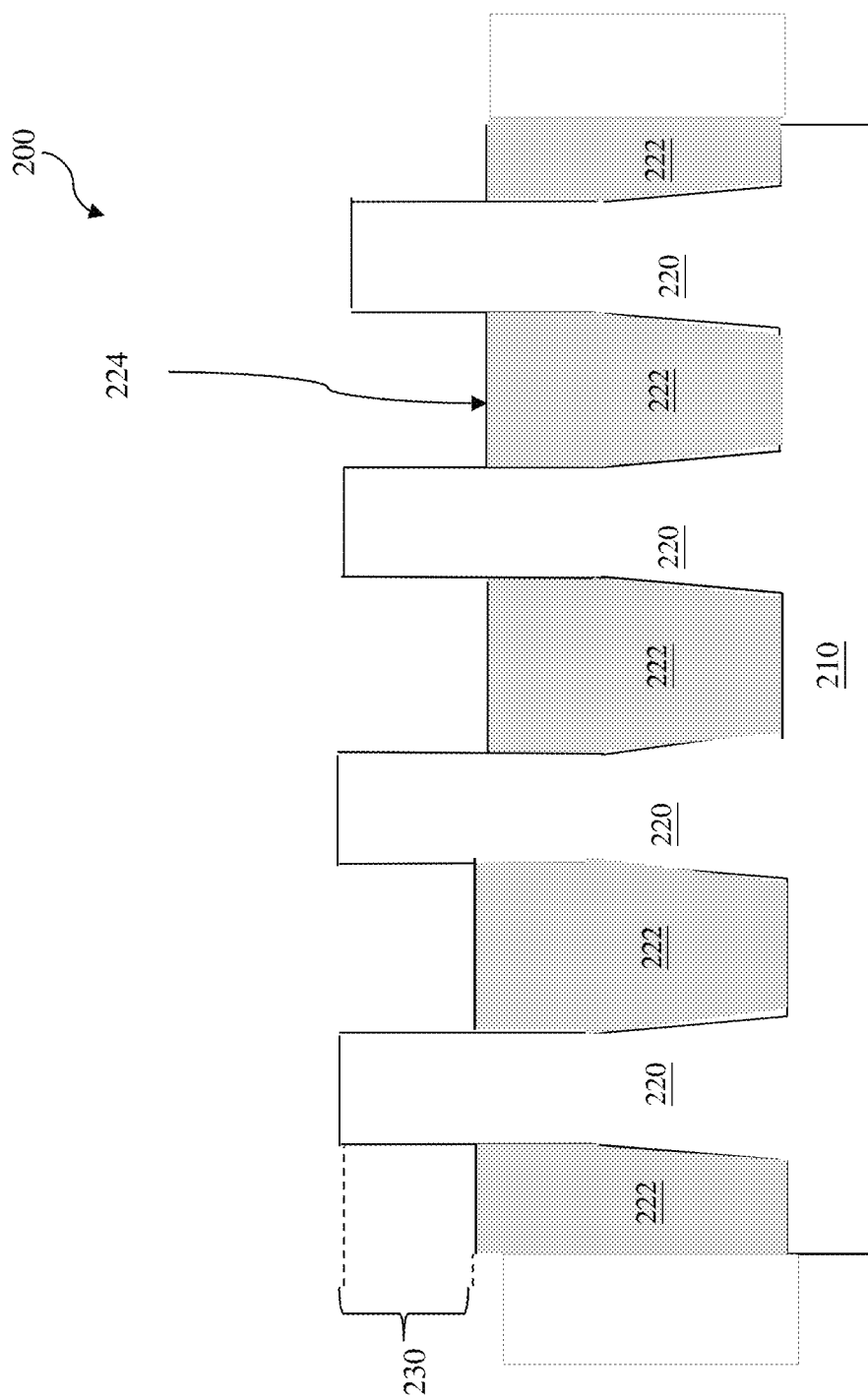

FIG. 3 illustrates recessed STI regions 222 and an exposed top portion 230 of fins 220. The recessing of STI regions 222 may include a chemical etch process, for example, using hydrofluoric acid (HF) and ammonia (NH3) or nitrogen trifluoride (NF3) and ammonia (NH3), reaction gas either with or without plasma. When HF is used as the reaction solution, a dilution ratio of HF may be between about 1:50 to about 1:100. Alternatively, the STI regions 222 may be recessed by a dry etch. The etching selectively removes the STI regions 222 but does not substantially etch the fins 220. Furthermore, top surfaces 224 of different STI regions 222 may or may not be substantially level. For example, due to recessing process (e.g., chemical etching), STI regions 222 at peripheral regions of fins 220 may have a top surface that is lower than STI regions 222 disposed between fins 220. In other embodiments, top surfaces 224 of STI regions 222 may be concave, substantially flat, or convex. After the STI regions are recessed, top portions 230 of fins 220 are higher than the top surfaces 224 of STI regions 222.

Figure 4A:
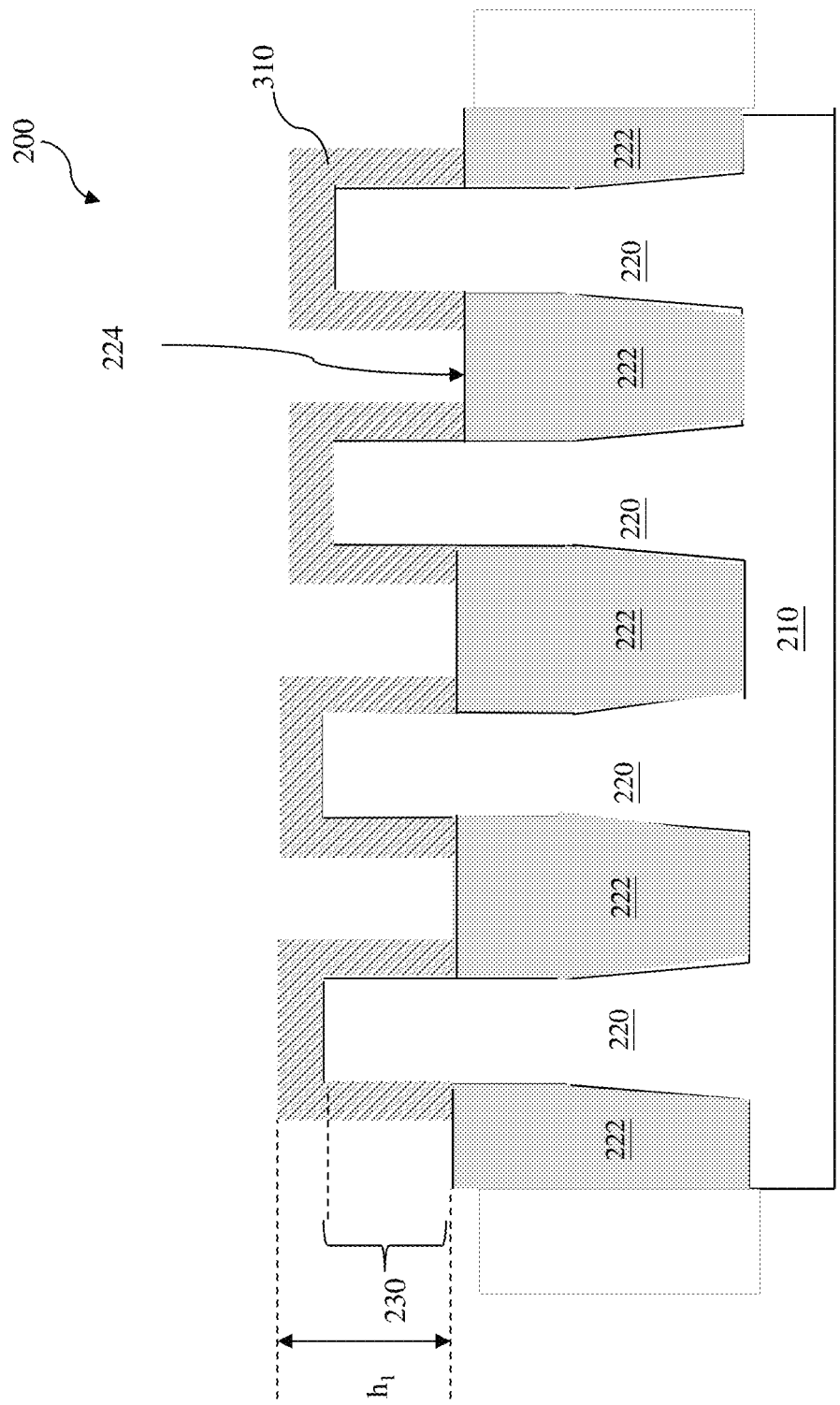

FIG. 4A illustrates a quantum well (QW) structure 310 formed over, including warping over, the top portion 230 of the fins 220. The QW structure 310 is formed with a first height $h_1$ (a distance from a top point of the QW structure 310 to a top surface 224 of the recessed STI region 222). The QW structure 310 may include a single quantum well (SQW) structure, which may be configured by different semiconductor materials from the fin 220. Alternatively, the QW structure 310 may include a multiple quantum well (MQW) structure, which may be configured by a plurality of SQWs in a stack. The MQW structure preserves the advantages of a SQW structure and has a larger volume of the active region. In one embodiment, QW semiconductor materials may include indium gallium arsenic InGaAs or SiGe. In one embodiment, a total thickness of the SQW structure is less than about 10 nm.

The QW structures 310 may be formed by epitaxially growing semiconductor material layers over the top portion 230 of the fins 220. The epitaxial processes may include CVD deposition techniques (e.g., vapor-phase epitaxy (VPE) and/or ultra-high vacuum CVD (UHV-CVD)), molecular beam epitaxy, metal organic chemical vapor deposition (MOCVD, metalorganic vapor phase epitaxy or MOVPE), and/or other suitable processes. For example, the SiGe or InGaAs QW structure 310 can be epitaxy grown.

Figure 4B:
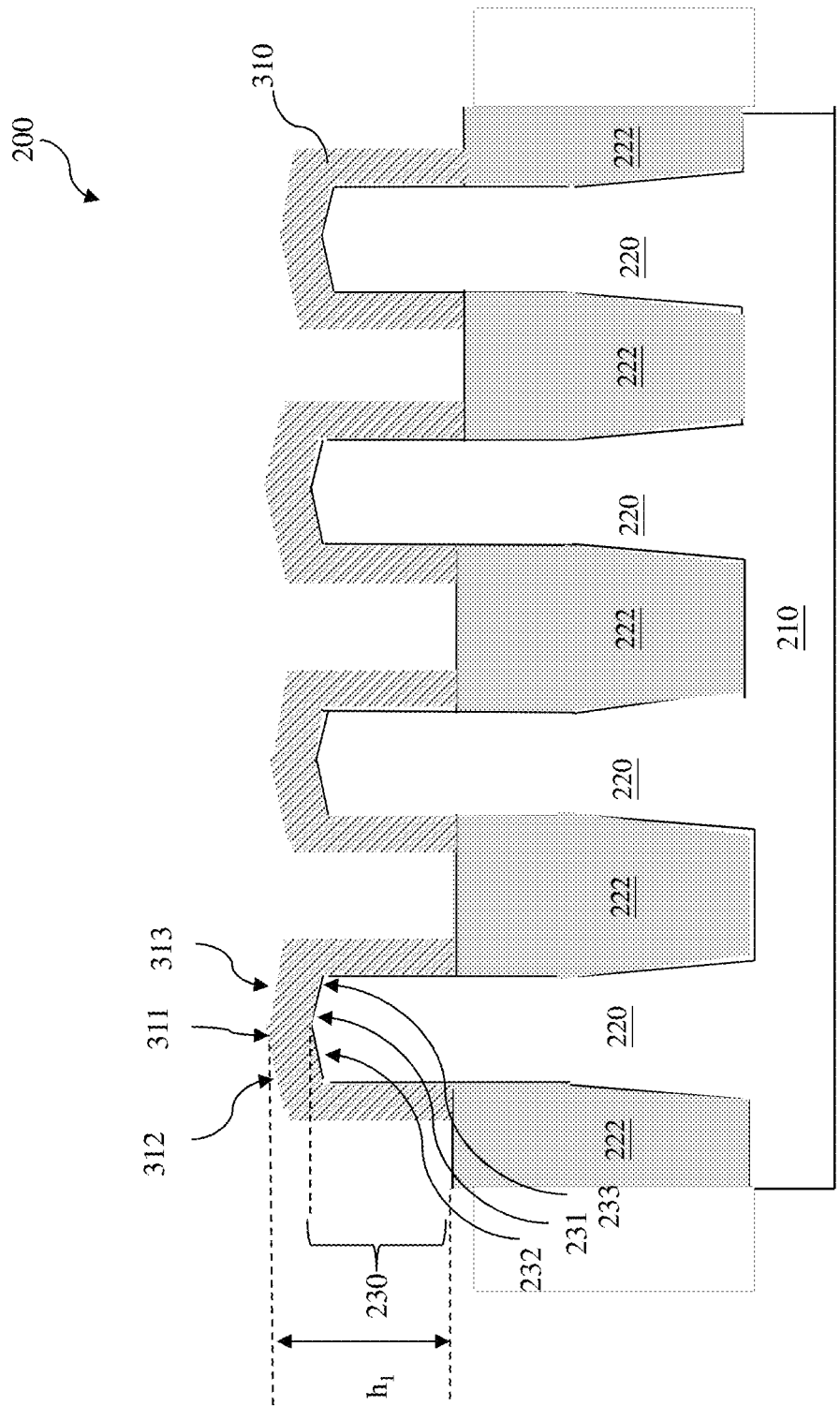

FIGS. 4B to 4E illustrate various shapes of the QW structure 310 formed over the top portion 230 of the fin 220 having various top profiles. In one embodiment, the QW structure 310 is formed with a top profile having structure has a first QW facet 312 and a second QW facet 313 at a first QW vertex 311 with a first fixed angle, as shown in FIG. 4B. The first QW vertex 311 may be formed by epitaxial growing semiconductor material over the top portion 230, which has a top profile having a first fin facet 232 and a second fin facet 233 at a first fin vertex 231. The first fin vertex 231 may be formed by trimming the top surface of the fin 220. For example, prior to recessing the STI region 222, an etching is applied to trim the top surface of the fin 220 to form the fin vertex 231. The etch process includes a wet etch, a dry etch, or a combination thereof.

Figure 4C:
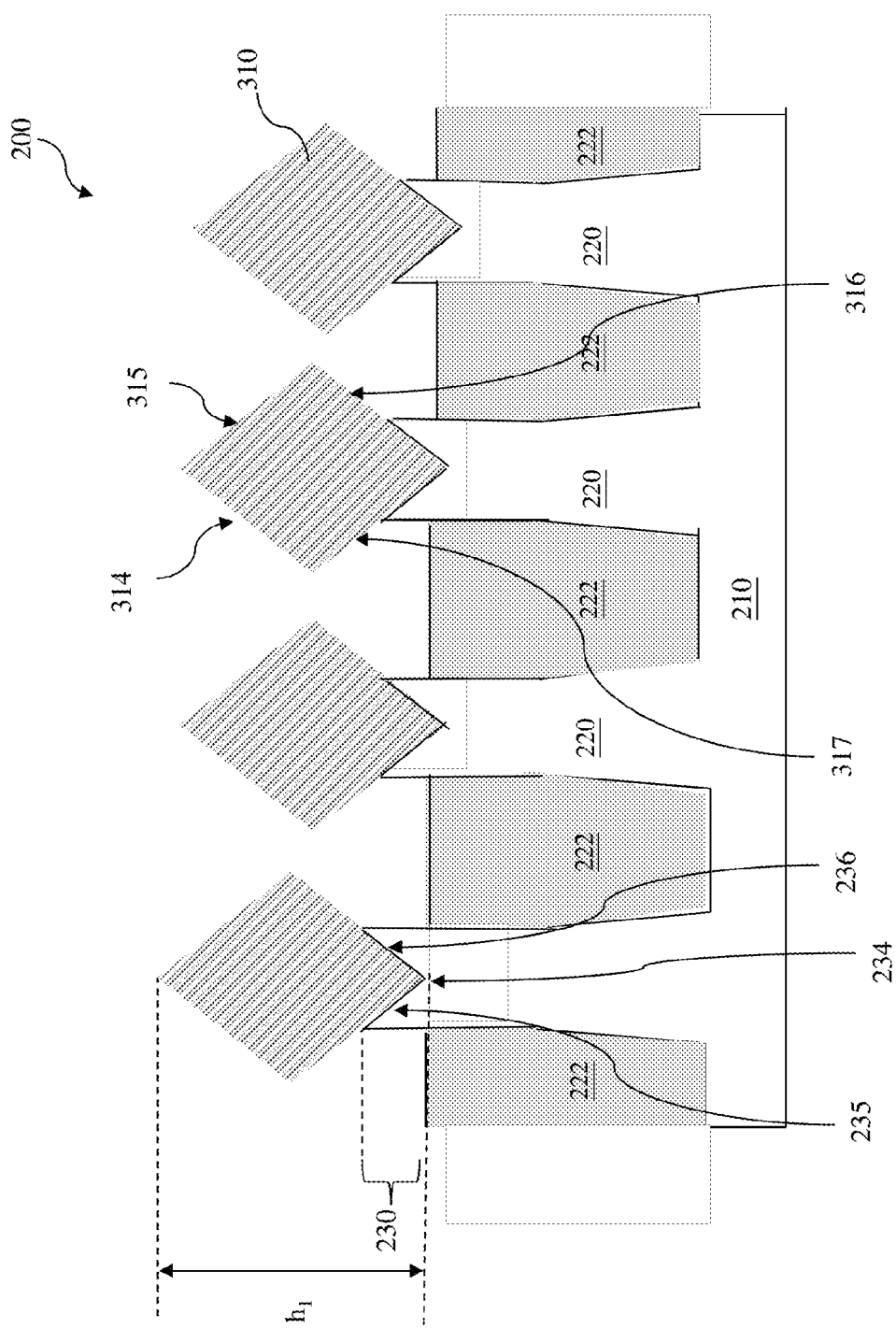

In another embodiment, the QW structure 310 has a third QW facet 314, a fourth QW facet 315, a fifth QW facet 316 and a sixth QW facet 317, as shown in FIG. 4C. The shape of the QW structure 310 is similar to a rhombus shape, meaning that the third facet 314 is parallel to the fifth facet 316 and the fourth facet 315 is parallel to the sixth facet 317. These QW four facets, 314, 315, 316 and 317, may be made by epitaxial growing semiconductor material over the top portion 230, which has a top profile having a trench vertex 234. The trench vertex 234 is formed by a third fin facet 235 and a fourth fin facet 236. The trench vertex 234 may be formed by recessing the top surface of the fin 220. For example, prior to recessing the STI region 222, an etching is applied to recess the top surface of the fin 220 to form the trench vertex 234. The etch process includes a wet etch, a dry etch, or a combination thereof.

Figure 4D:
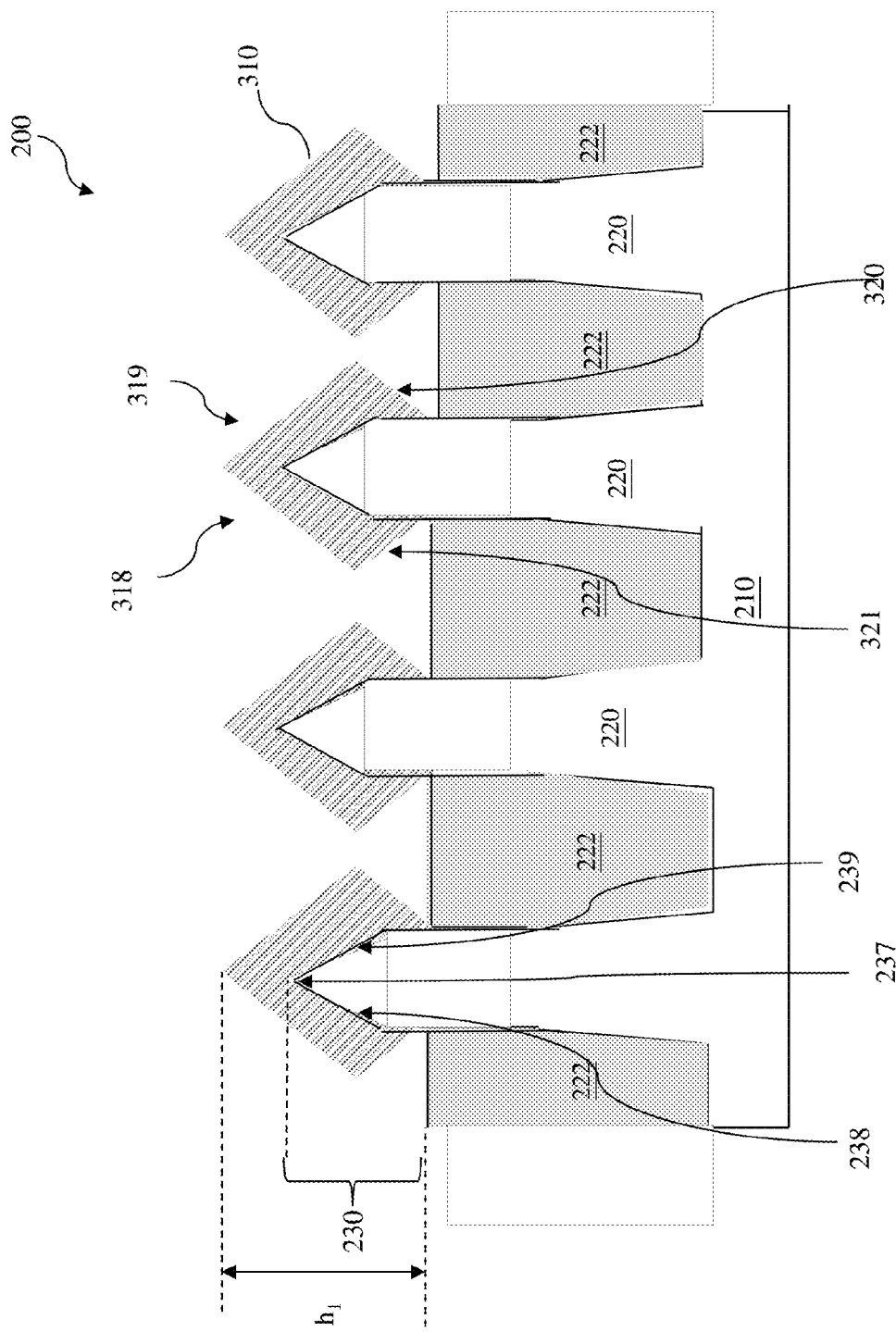
Figure 4E:
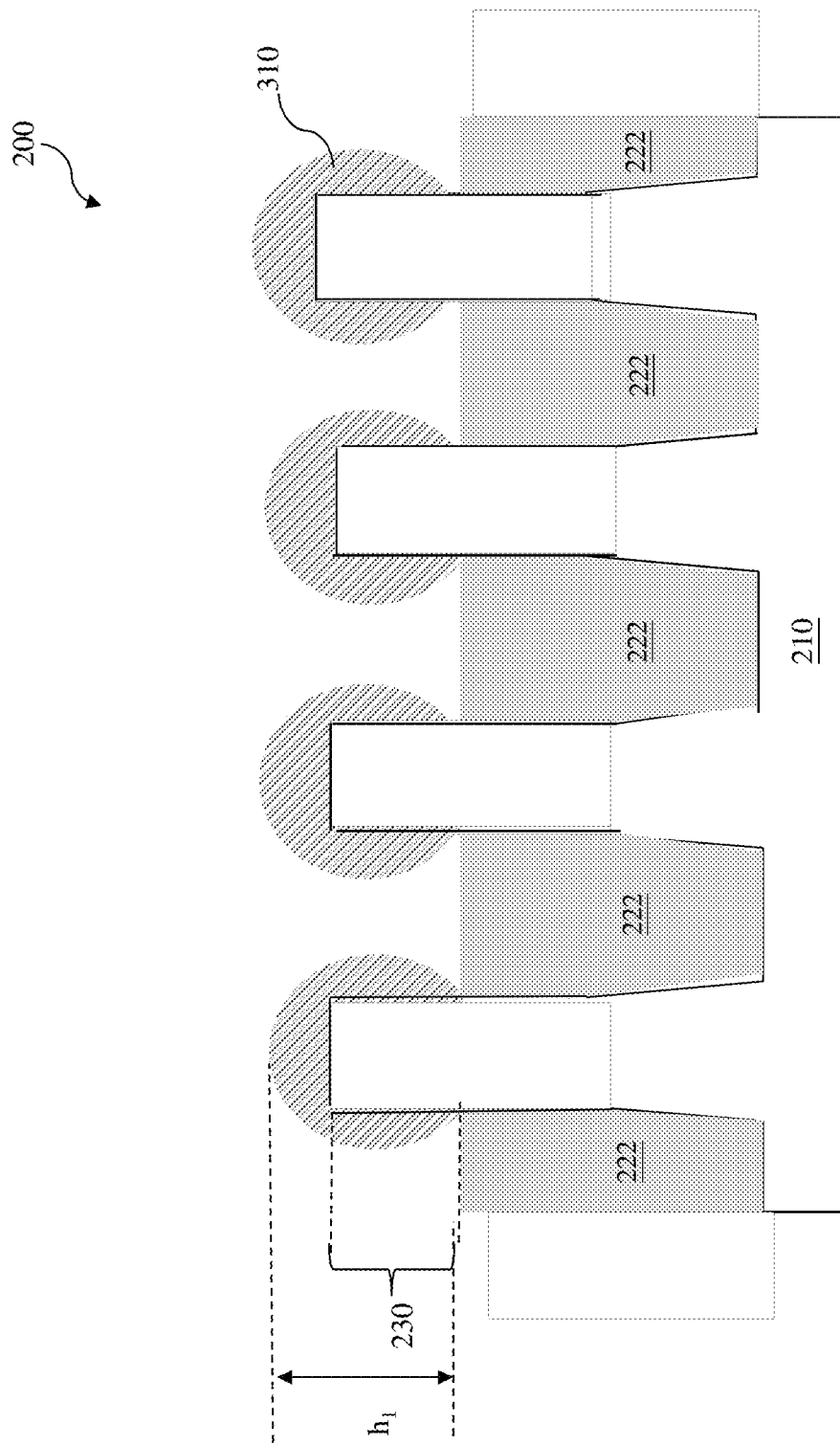

In yet another embodiment, a top surface of the QW structure 310 has a seventh QW facet 318, a eighth QW facet 319, a ninth QW facet 320 and a tenth QW facet 321, as shown in FIG. 4D. The shape of the QW structure 310 is similar to a partial rhombus shape, meaning that the seventh facet 318 is parallel to the ninth facet 320 and the eighth facet 319 is parallel to the tenth facet 321. These QW four facets, 318, 319, 320 and 321, may be made by epitaxial growing semiconductor material over the top portion 230, which has a top profile having a second fin vertex 237 at the highest point of the top profile. The second fin vertex 237 is formed by a fifth fin facet 238 and a sixth fin facet 239. The second fin vertex 237 can be rounded. The second fin vertex 237 may be formed by trimming the top surface of the fin 220. For example, prior to recessing the STI region 222, an etching is applied to trim the top surface of the fin 220 to form the second vertex 237. The etch process includes a wet etch, a dry etch, or a combination thereof. In yet another embodiment, the QW structure 310 is formed with a partial spheres shape, as shown in FIG. 4F.

Figure 5A:
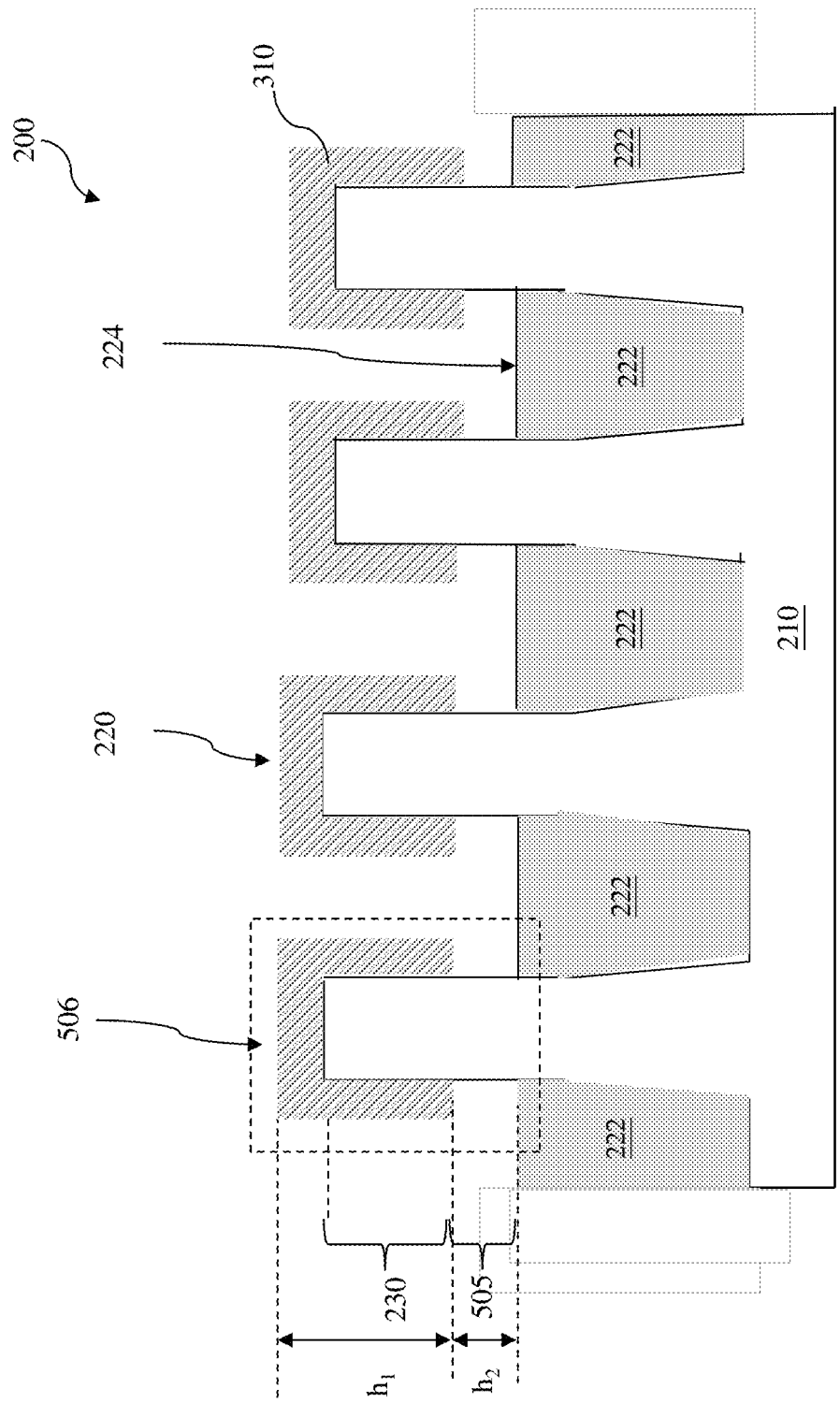

FIG. 5A illustrates further recessed STI regions 222 and exposed a middle portion 505 of fins 220. The recessed STI regions 222 is etched back further by a proper etching process, such as a selective wet etch, or a chemical etch process, for example, using hydrofluoric acid (HF) and ammonia (NH$_3$) or nitrogen trifluoride (NF$_3$) and ammonia (NH$_3$), reaction gas either with or without plasma. The etching selectively removes the STI regions 222 but does not substantially etch the QW structure 310. The middle portion 505 of fins 220 is then exposed and has a second height h$_2$. In the present embodiment, a ratio of the second height h$_2$ to the first height$_1$ is less than about 0.6, but greater than about zero. The QW structure 310 and the middle portion 505 of the fins 220 together are referred to as a combo QW structure. The combo QW structure 506 has the QW structure 310 as its upper portion and the middle portion 505 of the fin 220 as its lower portion, referred as to the lower portion 505 of the QW structure 506. In the present embodiment, the QW structure 310 has a different semiconductor material than the fin 220. The shape of the QW structure 310 shown in FIG. 5A is one of examples and the shape of the QW structure 310 could be facet or circle or diamond shaped.

Figure 5B:
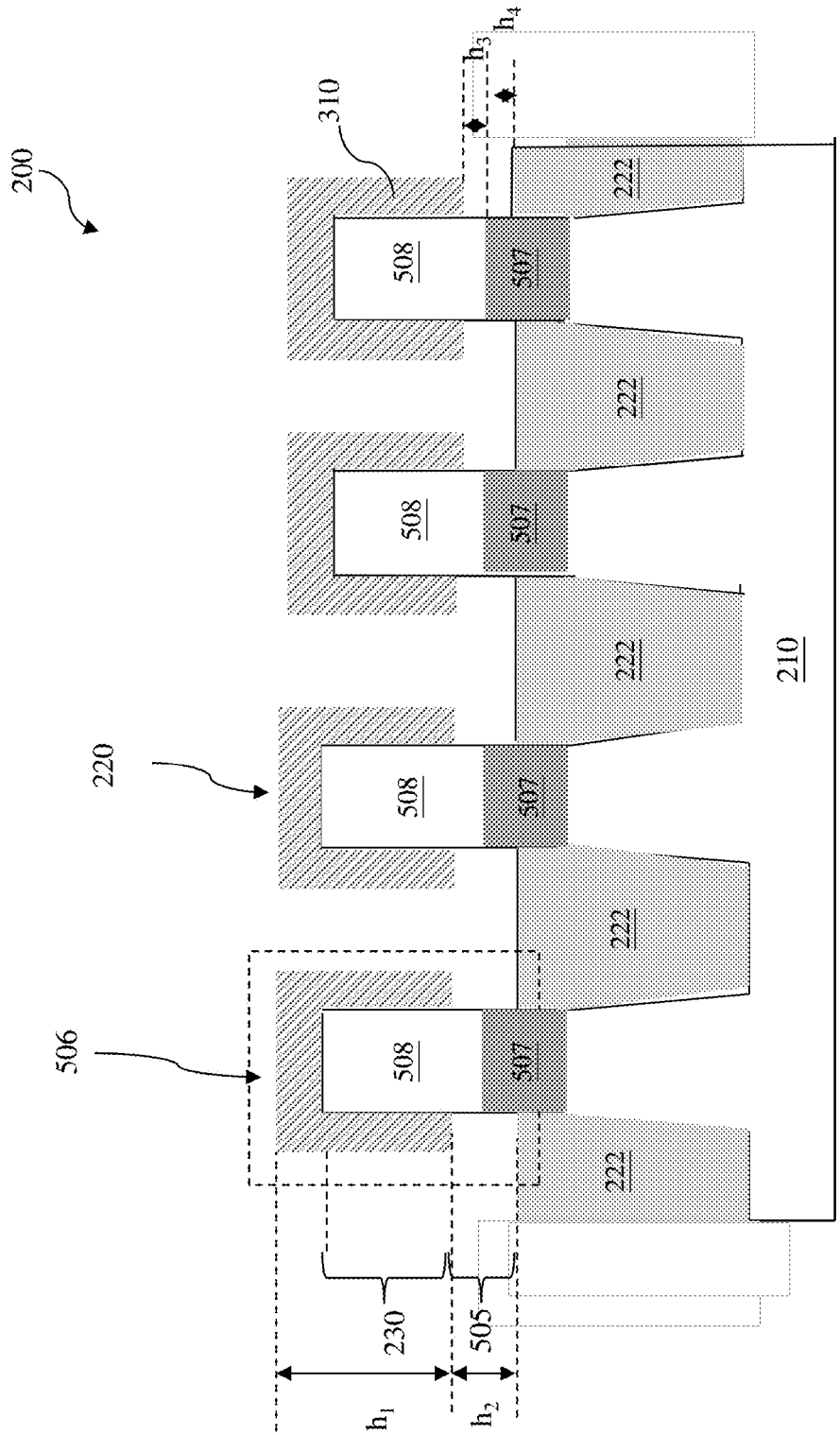

FIG. 5B illustrates another embodiment of the combo QW structure 506. In this embodiment, the fin 220 includes a second semiconductor material layer 507 as its middle portion, a third semiconductor material layer 508 as its upper portion and the semiconductor material layer 210 as its bottom portion. The second semiconductor material layer 507 may be formed by recessing the fin 220 and epitaxially growing the second semiconductor material layer 507 over the recessed fin 220. Then it followed by epitaxially growing the third semiconductor material layer 508 over the second semiconductor material layer 507. The QW structure 310 is formed over an upper section of the third semiconductor material layer 508 and it does not cover a low section of the third semiconductor material layer 508. When STI is recessed further, the lower section of the third semiconductor material layer 508 is exposed, as well as an upper section of the second semiconductor material layer 507 of the fin 220. Therefore, the lower section of the third semiconductor material layer 508 combining with the upper section of the second semiconductor material layer 507 forms a lower portion 505 of the combo QW structure 506, while the QW structure 310 forms an upper portion. In the present embodiment, the second semiconductor material layer 507 and the third semiconductor material layer 508 have different semiconductor materials to each other and to the QW structure 310. The exposed lower section of the third semiconductor material layer 508 has a third height h$_3$ and the exposed upper section of the second semiconductor material layer 507 has a fourth height h$_4$. A sum height of h$_3$ and h$_4$ is equal to the second height h$_2$.

Figure 6:
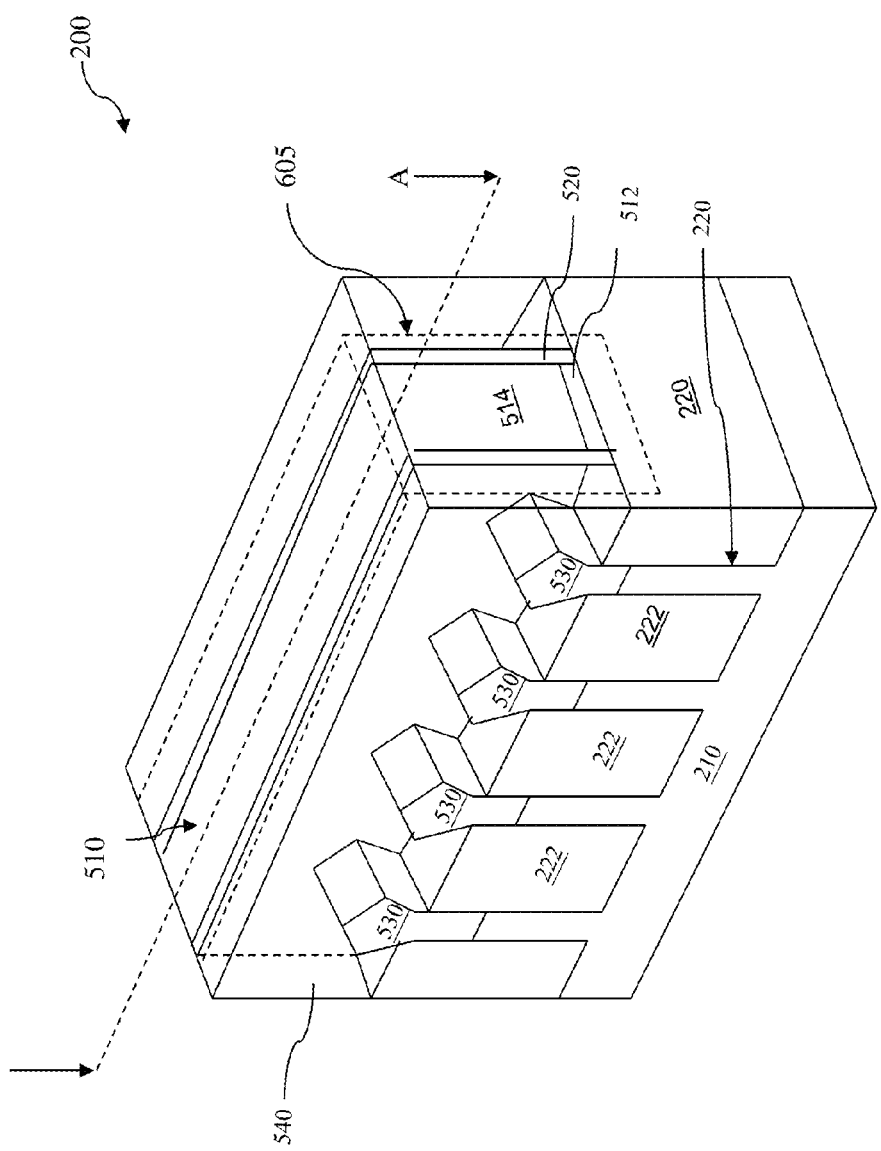
FIG. 6 is a diagrammatic perspective view of an example QWFinFET device in accordance with some embodiments.

FIG. 6 illustrates dummy gate stacks 510, gate spacers 520 and sources/drains (S/D) 530 formed over the substrate 210. One or more dummy gate stacks 510 formed over the substrate 210, including over the top portion 230 of the fins 220, where it is referred to as a gate channel region 605. The dummy gate stacks 510 are to be replaced later by a high-k (HK) and metal gate (MG) after high thermal temperature processes are performed, such as thermal processes during sources/drains (S/D) formation. The dummy gate stack 510 may include a dummy dielectric layer 512, a polysilicon layer 514. The dummy gate stack 510 is formed by any suitable process or processes. For example, the gate stack 510 can be formed by a procedure including deposition, photolithography patterning, and etching processes. The deposition processes include CVD, PVD, ALD, other suitable methods, and/or combinations thereof. The photolithography patterning processes include photoresist coating, exposure and developing the photoresist. The etching processes include dry etching, wet etching, and/or other etching methods (e.g., reactive ion etching). The dielectric layer 512 includes silicon oxide, silicon nitride, or any other suitable materials. The shape of the QW structure 310 shown in FIG. 5B is one of examples and the shape of the QW structure 310 could be facet or circle or diamond shaped.

Sidewall spacers 520 may be formed along the dummy gate stacks 510. The sidewall spacers 520 may include a dielectric material such as silicon oxide, silicon nitride, silicon carbide, silicon oxynitride, or combinations thereof. Typical formation methods for the sidewall spacers 520 include depositing a dielectric material over the gate stack and then anisotropically etching back the dielectric material. The etching back process may include a multiple-step etching to gain etch selectivity, flexibility and desired overetch control.

S/D features 530 are formed on the substrate 210. The features 530 may be formed by recessing a portion of the fin 220 beside the gate channel region 605 to form source/drain recessing trenches and epitaxially growing a semiconductor material layer on the recessed fin 220 in the sources/drains recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features 430 may be formed by one or more epitaxy or epitaxial (epi) processes. The S/D features 430 may be in-situ doped during the epi process. For example, the epitaxially grown SiGe S/D features 430 may be doped with boron; and the epitaxially grown Si epi S/D features 430 may be doped with carbon to form Si:C source/drain features, phosphorous to form Si:P source/drain features, or both carbon and phosphorous to form SiCP source/drain features. In one embodiment, the S/D features 430 are not in-situ doped, an implantation process (i.e., a junction implant process) is performed to dope the S/D features 430. One or more annealing processes may be performed to activate source/drain epitaxial feature. The annealing processes comprise rapid thermal annealing (RTA) and/or laser annealing processes.

An interlayer dielectric (ILD) layer 540 may be formed on the substrate 210, including between the dummy gate stacks 510. The ILD layer 540 includes silicon oxide, oxynitride or other suitable materials. The ILD layer 540 includes a single layer or multiple layers. The ILD layer 540 is formed by a suitable technique, such as CVD, ALD and spin-on (SOG). A chemical mechanical polishing (CMP) process may be performed to remove excessive ILD layer 540 and planarize the top surface of the ILD layer 540 with the top surface of the dummy gate stacks 510.

The following description will be directed to the QW structure 310 structure shown in FIG. 4A, it being understood that various shapes of the QW structure 310 can benefit from the present disclosure.

Figure 7:
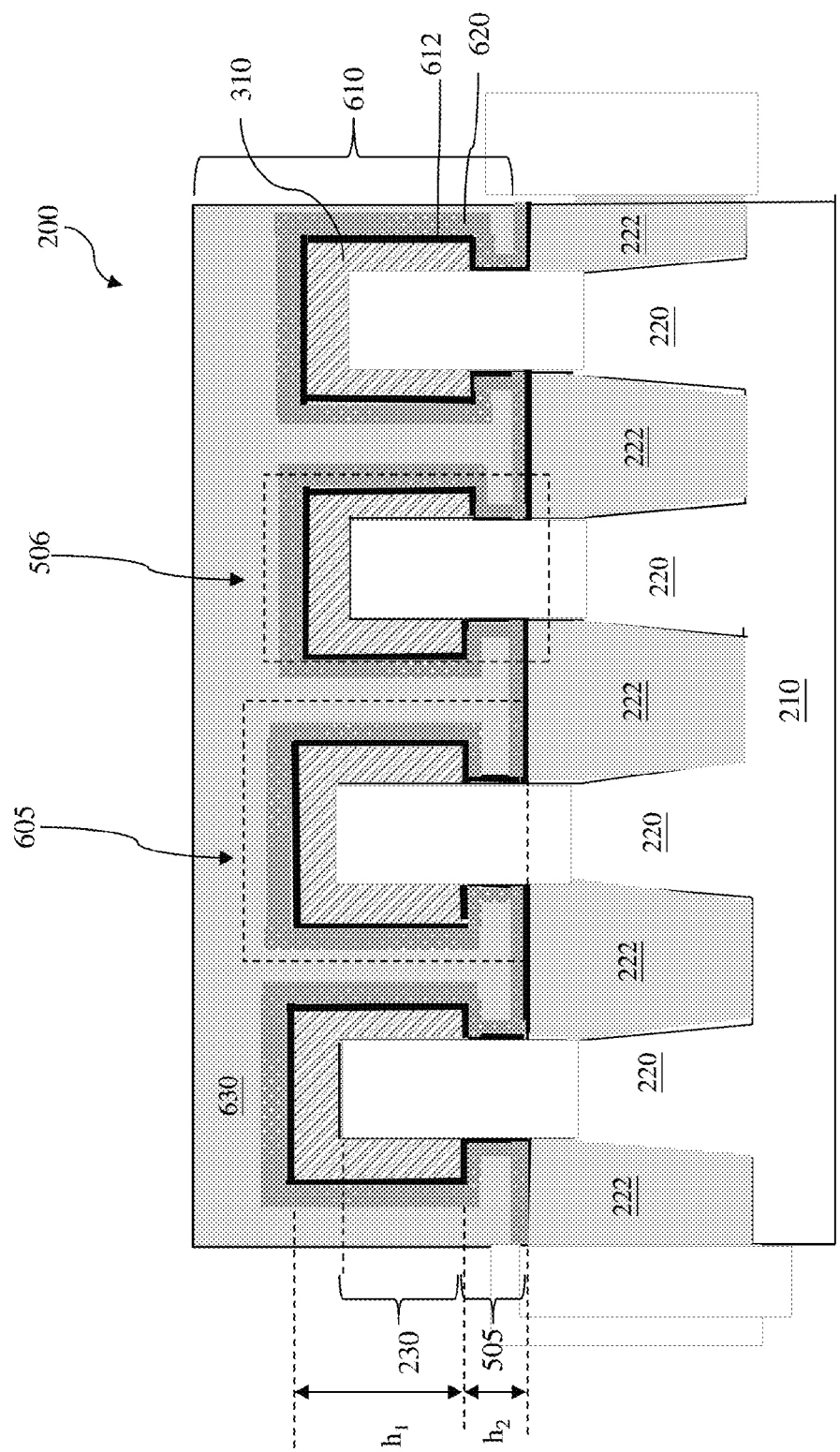
FIG. 7 is a cross-sectional view of an example QWFinFET device along the line A-A in FIG. 6.

FIG. 7 illustrates a gate stack 610 formed over the substrate 210, including wrapping over the combo QW structure 506. In one embodiment, a dummy gate stack 510 is replaced by the gate stack 610. The gate stacks 610 include gate dielectric layer and gate electrode over the gate dielectric. The gate dielectric layer includes an interfacial layer (IL) 612 deposited by a suitable method, such as atomic layer deposition (ALD), CVD, thermal oxidation or ozone oxidation. In the present embodiment, the gate dielectric layers, 612 and 620, wrap over the combo QW structure 506. The IL 612 includes oxide, HfSiO and oxynitride. A HK dielectric layer 620 is deposited on the IL 612 by a suitable technique, such as ALD, CVD, metal-organic CVD (MOCVD), physical vapor deposition (PVD), other suitable technique, or a combination thereof. The HK dielectric layer 620 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

A metal gate (MG) electrode 630 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 520 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 520 may be formed by ALD, PVD, CVD, or other suitable process. A CMP process may be performed to remove excessive MG electrode 620.

In the completed QWfinFET device 200, channel regions 405 are defined as the combo QW structure 506 wrapped over by the gate stack 610. In the present embodiment, channel regions 605 include at least two different semiconductor materials, the lower portion 505 of the combo QW structure 506 (e.g., a low $D_{it}$ material such as silicon) and the QW structure 310 (e.g., a high mobility material such as the InGaN/GaN). As illustrated by FIG. 7, the upper portion of the combo QW structure 506 (the QW structure 310) has the first height $h_1$ while the lower portion 505 of the combo QW structure 506 has the second height $h_2$. In various embodiments, a ratio of the second height $h_2$ to the first height $h_1$ is less than about 0.6, but greater than about zero for improved electrical performance (e.g., improved overall mobility). By using the combo QW structure 506 in channel region 405, particularly in the above stated ratio, the resulting QWfinFET may have improved mobility and electrical performance compared to traditional QWfinFETs having single semiconductor material channel regions. The shape of the QW structure 310 shown in FIG. 5B is one of example and the shape of the QW structure 310 could be facet or circle or diamond shaped.

The QWFinFET device 200 may undergo CMOS or MOS technology processing to form various features and regions known in the art.

Figure 8:
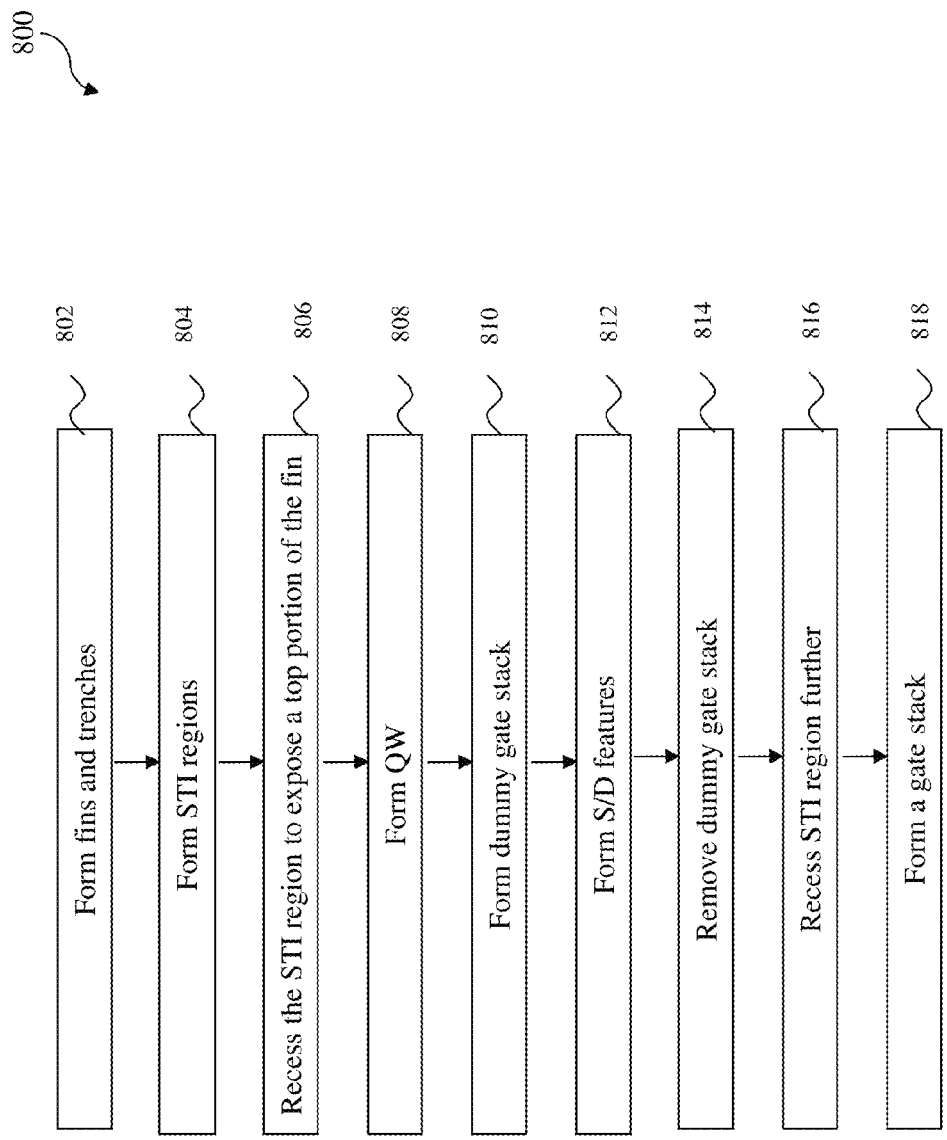
FIG. 8 is a flow chart of an example method for fabricating a QWFinFET device in accordance with some embodiments.

The present disclosure also provides various methods for fabricating a QWFinFET device, such as the QWFinFET device 200. FIG. 8 is a flowchart of a method 800 for fabricating a QWFinFET device (the QWFinFET 200 in FIG. 7 in the present embodiment). The method 800 start at step 802 by forming fins 220 and trenches 216 over the substrate 210 by using proper procedures, such as a combination of photolithography and etching.

The method 800 proceeds to step 804 by forming STI regions 222 over the substrate 210. As one example, the formation of an STI regions includes a photolithography process, an etch process to etch a trench in the substrate 210 (for example, by using a dry etching and/or wet etching), and a deposition to fill in the trench (for example, by using a chemical vapor deposition process) with one or more dielectric materials. In some examples, the filled trench may have a multi-layer structure such as a thermal oxide liner layer filled with silicon nitride or silicon oxide. A CMP process may be performed to remove excessive dielectric materials.

The method 800 proceeds to step 806 by recessing the STI regions 222 to expose the top portion 230 of the fin 220. The STI regions 222 may be recessed by a selective wet etch, or a selective dry etch, which etches the STI 222 but does not substantially etch the fin 220.

The method of 800 proceeds to step 808 by forming QW structures 310 wrapping over the top portion 230 of fins 220. The QW structures 310 are formed by epitaxially growing semiconductor materials over the top portion 230 of fin 220. The QW structures 310 may be formed in various shapes.

The method of 800 proceeds to step 810 by forming dummy gate stack 410 and gate spacer 420 over the substrate 210, including wrapping over the QW structure 310. In one embodiment, the dummy gate stacks 410 are formed by procedures, such as deposition, patterning and etching. The gate spacers 420 are formed by deposition and an anisotropic dry etch.

The method of 800 proceeds to step 812 by forming S/D features 430. In one embodiment, the S/D features 430 are formed by recessing a portion of the fin 220 beside of the dummy gate stack 410 (gate spacers 420 as well) and epitaxially growing semiconductor materials over the recessed fin s 220.

The method proceeds to step 814 by removing the dummy gate stacks 510 to from a gate trench. The QW structure 310 and the STI region 222 are exposed in the gate trench. In one embodiment, the dummy gate stacks 510 are removed by a selective wet etch, or a selective dry etch. In another embodiment, the dummy gate stack 510 are removed by lithography patterning and etching processes.

The method proceeds to step 816 by recessing the STI regions 222 further in the gate trench to expose the middle portion 505 of the fins 220. The recess is similar in many respects to those discussed above in step 806. In the present embodiment, the QW structure 310 with the middle portion 505 of the fin 220 together is referred to as the combo QW 506.

The method proceeds to step 818 by forming the gate stack 610 over the substrate 210, including wrapping over the combo QW structure 506. In one embodiment, the gate stack 610 is a HK/MG stack and formed by proper depositing techniques.

In the method 800, recessing STI region 222 further to form combo QW 315 (at step 616) is implemented after forming S/D feature 430 (step 612), the method 800 is then referred to as a method of QW first/recess last.

Figure 9:
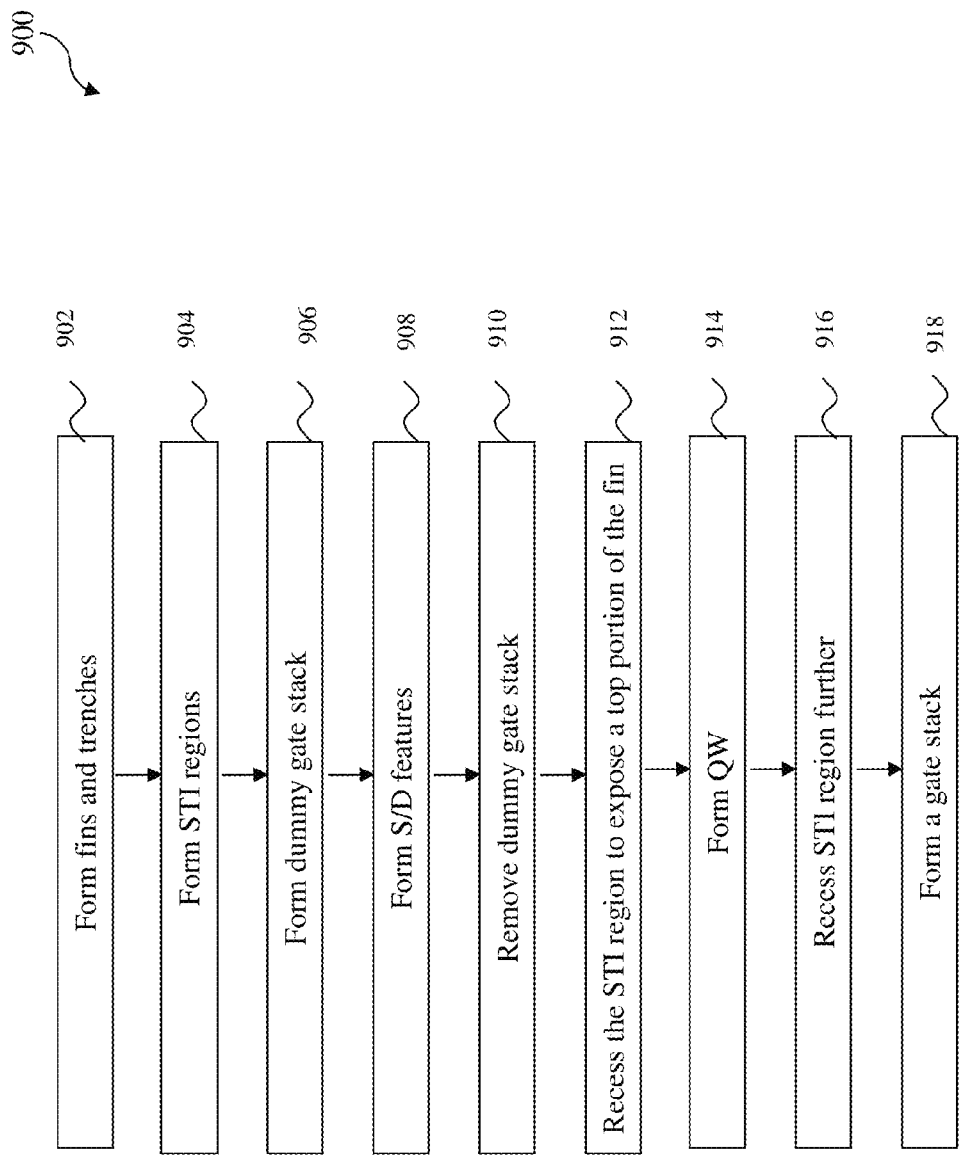
FIG. 9 is a flow chart of another example method for fabricating a QWFinFET device in accordance with some embodiments.

FIG. 9 is a flowchart of another example method 900 for fabricating a QWFinFET device (the QWFinFET 200 in FIG. 7 in the present embodiment). The first three steps of the method 900, 902, 904 and 906, are similar in many respects to those discussed above in steps 802, 804 and 806, respectively, of the method 800.

The method 900 proceeds to step 908 by forming dummy gate stacks 510 over the substrate 210, including wrapping over the top portion 230 of the fin 220. The step 808 is also similar in many respects to those discussed above in step 810 of the method 800.

The method 900 proceeds to step 910 and followed by step 912 by forming the S/D features 430 and removing the dummy gate 510, which are similar in many respects to those discussed above in steps 808 and 810, respectively, of the method 800.

The method 900 proceeds to step 914 by forming QW structures 310 over the top portion 230 of the fin 220, which is similar in many respects to those discussed above in step 808 of the method 800.

The method 900 proceeds to step 916 and then followed by step 918 by recessing the STI regions 222 further to form the combo QW structure 506 and forming the gate stack 610 over the combo QW structure 506. The steps 916 and 918 are similar in many respects to those discussed above in steps 816 and 818, respectively, of the method 800.

In the method 900, the QW structures 310 and the combo QW structure 506 are formed (steps 910 to 916) after forming S/D feature 430 (step 910), the method 900 is then referred to as a method of QW last/recess last.

The QWFinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the methods 800 and 900, and some operations described above may be replaced or eliminated for other embodiments of the method.

Based on the above, the present disclosure offers a gate stack formed over a combo QW structure. The combo QW structure employs a lower portion, which provides a low Dit and an upper portion, which provides high electron mobility. The combo QW structure demonstrates device performance improvements.

Thus, present disclosure provides a quantum well fin field effect transistor (QWFinFET). The QWFinFET includes a semiconductor fin over a substrate and a combo quantum well (QW) structure over the semiconductor fin. The combo QW structure includes a QW structure over a top portion of the semiconductor fin and a middle portion of the semiconductor fin. The semiconductor fin and the QW comprise different semiconductor materials. The QWFinFET also includes a gate stack over the combo QW structure.

The present disclosure also provides another embodiment of a semiconductor device. The device includes a fin extending upwards from a semiconductor substrate, a QW structure disposed over a top portion of the fin. The QW structure includes a different semiconductor material than the fin. The device also includes a gate stack disposed over, including wrapping over, the QW structure and extending to a middle portion of the fin.

The present disclosure also provides a method for forming a semiconductor device. The method includes forming a semiconductor fin over a substrate, forming a shallow trench isolation (STI) region between semiconductor fin, forming a quantum well (QW) structure over a top portion of the semiconductor fin, recessing the STI region to expose a middle portion of the semiconductor fin, below the QW structure and forming a gate stack wrapping over the QW structure and the middle portion of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A quantum well fin field effect transistor (QWFinFET) comprising:
    a semiconductor fin over a substrate;
    a combo quantum well (QW) structure over the substrate, the combo QW structure including:
        a QW structure wrapping over a top portion of the semiconductor fin; and
        a middle portion of the semiconductor fin that is not covered by the QW structure, wherein the semiconductor fin and the QW structure comprise different semiconductor materials; and
    a gate stack wrapping over the combo QW structure.

2. The QWFinFET of claim 1, wherein a ratio of a height of the middle portion of the fin to a height of the QW structure to is less than about 0.6, but greater than zero.

3. The QWFinFET of claim 1, wherein the semiconductor material of the fin includes silicon (Si).

4. The QWFinFET of claim 1, wherein the gate stack includes a high-k/metal gate stack.

5. The QWFinFET of claim 1, wherein the QW structure includes multiple quantum well (MQW) structure.

6. The QWFinFET of claim 1, wherein the top portion of the fin has a top surface profile that having a first fin facet and a second fin facet at a first fin vertex.

7. The QWFinFET of claim 6, wherein the QW structure has a top profile having a first QW facet and a second QW facet at a first QW vertex, disposed over the top portion of the fin.

8. The QWFinFET of claim 1, wherein the top portion of the fin has a top profile that having a trench vertex with a third fin facet and a fourth fin facet.

9. The QWFinFET of claim 8, wherein the QW structure has a rhombus shape disposed over the top portion of the fin.

10. The QWFinFET of claim 1, wherein the top portion of the fin has a top profile having a fin vertex at the highest point of the top profile.

11. The QWFinFET of claim 10, wherein the QW structure has a partial rhombus shape disposed over the top portion of the fin.

12. The QWFinFET of claim 1, wherein the middle portion of the fin includes an upper portion and a lower portion, wherein the upper portion and the lower portion of the fin formed by different semiconductor materials.

13. The QWFinFET of claim 1, wherein a dielectric layer of the gate stack is in direct contact with both the QW structure and the middle portion of the semiconductor fin.

14. A semiconductor device comprising:
    a fin extending upwards from a semiconductor substrate;
    a QW structure wrapping over a top portion of the fin, wherein the QW structure includes a different semiconductor material than the fin; and
    a gate stack disposed over, including wrapping over, the QW structure and extending to a middle portion of the fin that is not covered by the QW structure.

15. The semiconductor device of claim 14, wherein a ratio of a height of the middle portion of the fin to a height of the QW to is less than about 0.6, but greater than about zero.

16. The semiconductor device of claim 14, wherein the fin comprises a first semiconductor material and the QW structure comprises a pair of a second and a third semiconductor materials, wherein the second and the third of semiconductor materials have a higher mobility than the first semiconductor material, and wherein the first semiconductor material has a lower interface trap density than the second and third semiconductor materials.

17. The semiconductor device of claim 16, wherein the QW structure includes:
   SiGex, x=15%~100%, where x represents Ge composition in atomic percent;
   or InxGayAsz, where x represents In composition in atomic percent, y represents Ga composition in atomic percent, z represents As composition in atomic percent.

18. A method for forming a semiconductor device comprises:
   forming a semiconductor fin over a substrate;
   forming a shallow trench isolation (STI) region between semiconductor fin;
   forming a quantum well (QW) structure wrapping over a top portion of the semiconductor fin, wherein the QW structure does not wrap over a middle portion of the semiconductor fin;
   recessing the STI region to expose the middle portion of the semiconductor fin; and
   forming a gate stack wrapping over the QW structure and the middle portion of the semiconductor fin.

19. The method of claim 18, wherein the forming the QW structure includes:
   recessing the STI region to expose the top portion of the semiconductor fin; and
   epitaxially growing a pair of semiconductor materials over the top portion of the semiconductor fin, wherein the pair of semiconductor materials are different than a semiconductor material of the semiconductor fin.

20. The method of claim 18, wherein a ratio of a height of the middle portion of the semiconductor fin to a height of the QW structure is controlled to be less than about 0.6, but greater than about zero.

* * * * *